United States Patent [19]

Yeh et al.

[11] Patent Number: 5,648,128
[45] Date of Patent: Jul. 15, 1997

[54] METHOD FOR ENHANCING THE GROWTH RATE OF A SILICON DIOXIDE LAYER GROWN BY LIQUID PHASE DEPOSITION

[75] Inventors: Ching-Fa Yeh; Tso-Hung Fan, both of Hsinchu, Taiwan

[73] Assignee: National Science Council, Taipei, Taiwan

[21] Appl. No.: 659,341

[22] Filed: Jun. 6, 1996

[51] Int. Cl.$^6$ .................................................. B06B 1/20
[52] U.S. Cl. ..................... 427/601; 427/430.1; 437/225
[58] Field of Search ............................... 427/601, 430.1; 437/225

[56] References Cited

PUBLICATIONS

C.F. Yeh, C.L. Chen, and G.H. Lin, "The Physicochemical Properties and Growth Mechanism of Oxide ($SiO_{2-x}F_x$) by Liquid Phase Deposition with $H_2O$ Addition Only", J. Electochem. Soc., vol. 141, No. 11, 3177 (1994). (no month avail.).

T.H. Fan, S.S. Lin, and C.F. Yeh, "Leakage current Conduction Mechanism of Liquid Phase Deposited (LPD) $SiO_2$ Film", Extended Abstracts of 1995 International Conference on Solid State Devices and Materials, Osaka, 1995, pp. 596–598. (no month avail.).

*Primary Examiner*—Bernard Pianalto
*Attorney, Agent, or Firm*—Hitt Chwang & Gaines, P.C.

[57] ABSTRACT

A liquid phase deposition method involves a reaction mixture composed of a hydrosilicofluoric acid aqueous solution supersaturated with silicon dioxide, and a semiconductor substrate disposed therein. The reaction mixture is treated with an ultrasonic oscillation at a frequency ranging between 20 and 100 KHz and at a temperature ranging between 10° and 50° C. for accelerating the growth rate of a silicon dioxide layer formed on the semiconductor substrate.

4 Claims, 3 Drawing Sheets

METHOD FOR ENHANCING THE GROWTH RATE OF A SILICON DIOXIDE LAYER GROWN BY LIQUID PHASE DEPOSITION

FIELD OF THE INVENTION

The present invention relates generally to a method for growing a silicon dioxide layer, and more particularly to a method for enhancing the growth rate of a silicon dioxide layer grown by the liquid phase deposition (LPD).

BACKGROUND OF THE INVENTION

A multilevel interconnection is playing an increasingly important role in the technology of the ultralarge scale integrated circuit. The important issue of the multilevel interconnection is the production of the insulation layer. The conventional methods for making the insulation layer of the multilevel interconnection include LPCVD, PECVD, APCVD, etc. According to these conventional methods, the insulation layer is grown at a temperature ranging between 300° C. and 700° C. Certain elements, which must be made at a relatively low temperature, are rather vulnerable to structural defects when they are exposed to such a high temperature as referred to above. For this reason, the use of the liquid phase deposition (LPD) in growing the insulation film of the multilevel interconnection is a new choice. A silicon dioxide layer grown by the liquid phase deposition has a low dielectric constant, a low growth temperature (25° C.), a low stress, and a high breakdown electric field intensity (>9 MV/cm). For further information, please refer to C. F. Yeh, C. L. Chen, and G. H. Lin, "THE PHYSICO-CHEMICAL PROPERTIES AND GROWTH MECHANISM OF OXIDE ($SiO_{2-x}F_x$) BY LIQUID PHASE DEPOSITION WITH $H_2O$ ADDITION ONLY", J. Electrochem. Soc. Vol. 141, No. 11, 3177 (1994); T. H. Fan, S. S. Lin, and C. F. Yeh, "LEAKAGE CURRENT CONDUCTION MECHANISM OF LIQUID PHASE DEPOSITION (LPD) $SiO_2$ FILM", Extended Abstracts of 1995 International Conference on Solid State Devices and Materials, Osaka, 1995, pp. 596–598.

A silicon dioxide layer may be grown by a method known as the liquid phase static deposition, in which silicon dioxide ($SiO_2$) powder is mixed with $H_2SiF_6$ aqueous solution at 23° C. until a $SiO_2$ saturated $H_2SiF_6$ solution is obtained. The excess $SiO_2$ particles of the $SiO_2$ saturated $H_2SiF_6$ solution are filtered out. Thereafter, water is added to the filtered solution to form a $SiO_2$ supersaturated $H_2SiF_6$ solution. Before, or at the time, or after water is added, a dry and clean chip is deposited without disturbance in the $SiO_2$ supersaturated $H_2SiF_6$ solution. The silicon dioxide layer is then formed on the surface of the chip. The chemical reaction is expressed by the following formula:

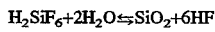

$$H_2SiF_6 + 2H_2O \rightleftharpoons SiO_2 + 6HF$$

It is readily apparent from the above chemical formula that the addition of water is favorable to shift the equilibrium point thereof to the right side.

The growth rate of the silicon dioxide layer by the liquid phase static deposition is about 250–2000 Å/hr., which is rather slow. The required thickness of the insulation film of the multilevel interconnection is 1 μm or more. It is therefore imperative that such a conventional liquid phase static deposition method as described must be improved so as to enhance the growth rate of the silicon dioxide layer.

SUMMARY OF THE INVENTION

It is therefore the primary objective of the present invention to provide an improved liquid phase deposition method for enhancing the growth rate of the silicon dioxide layer.

In keeping with the principle of the present invention, the foregoing objective of the present invention is achieved by the use of an ultrasonic oscillator. The present method for enhancing the growth rate of a silicon dioxide layer grown by a liquid phase deposition comprises disposing a semiconductor substrate in a reaction mixture containing a hydrosilicofluoric acid aqueous solution supersaturated with silicon dioxide, and applying an ultrasonic oscillation to said reaction mixture.

In conjunction with the employment of the ultrasonic oscillation, the fabrication of $SiO_2$ layer of the multilevel interconnection by the liquid phase static deposition is expedited. The ultrasonic oscillation is capable of inducing the reactant molecules of the $SiO_2$ liquid phase static deposition method to oscillate back and forth at their mean rest positions so as to bring about the translational energy, which serves to accelerate the growth rate of the silicon dioxide.

DETAILED DESCRIPTION OF THE PREFERRED EMBODIMENTS

Figure 1:
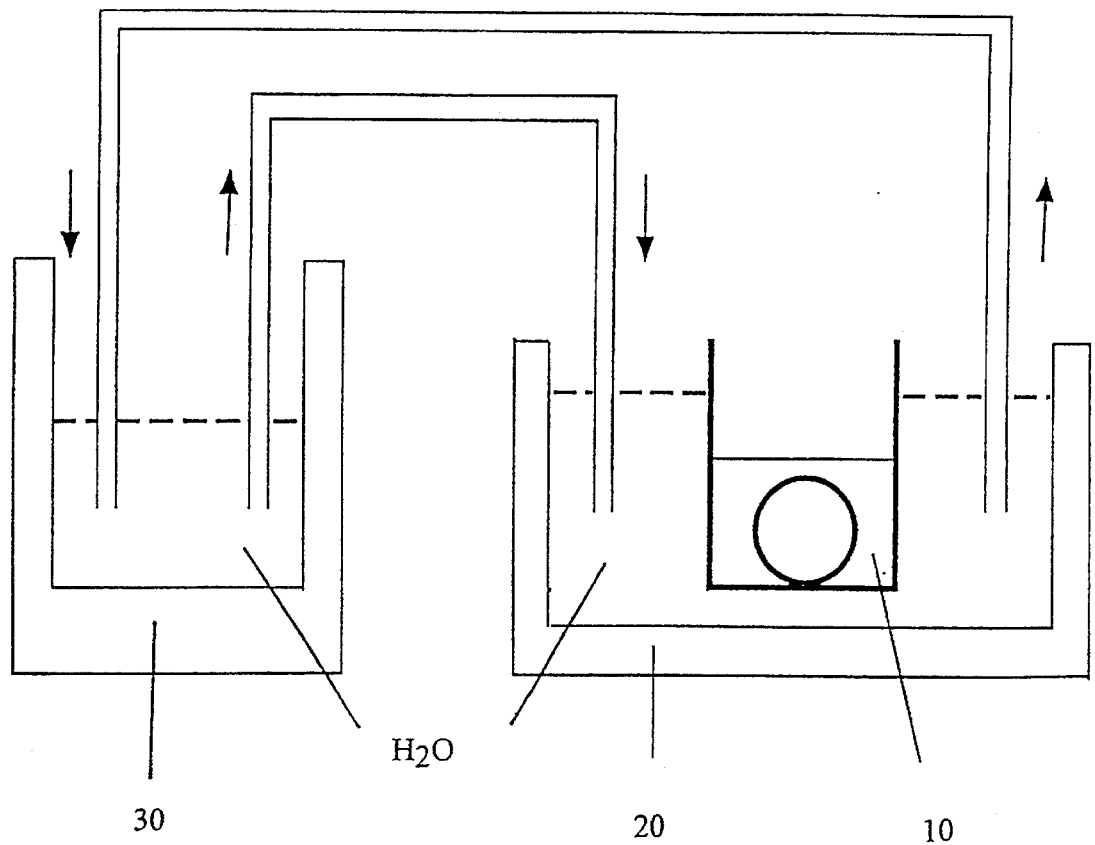
FIG. 1 shows a schematic view of an equipment layout for use in the method of the present invention.

As illustrated in FIG. 1, the equipment layout of the liquid phase static deposition method of the present invention includes an LPD growth tank 10, and an ultrasonic oscillation thermostatic water tank 20 in which the LPD growth tank 10 is located so as to enable the liquid phase static deposition reaction to take place in the presence of the ultrasonic oscillation. The water temperature of the tank 20 is kept constant by means of a thermostat 30.

Figure 2:
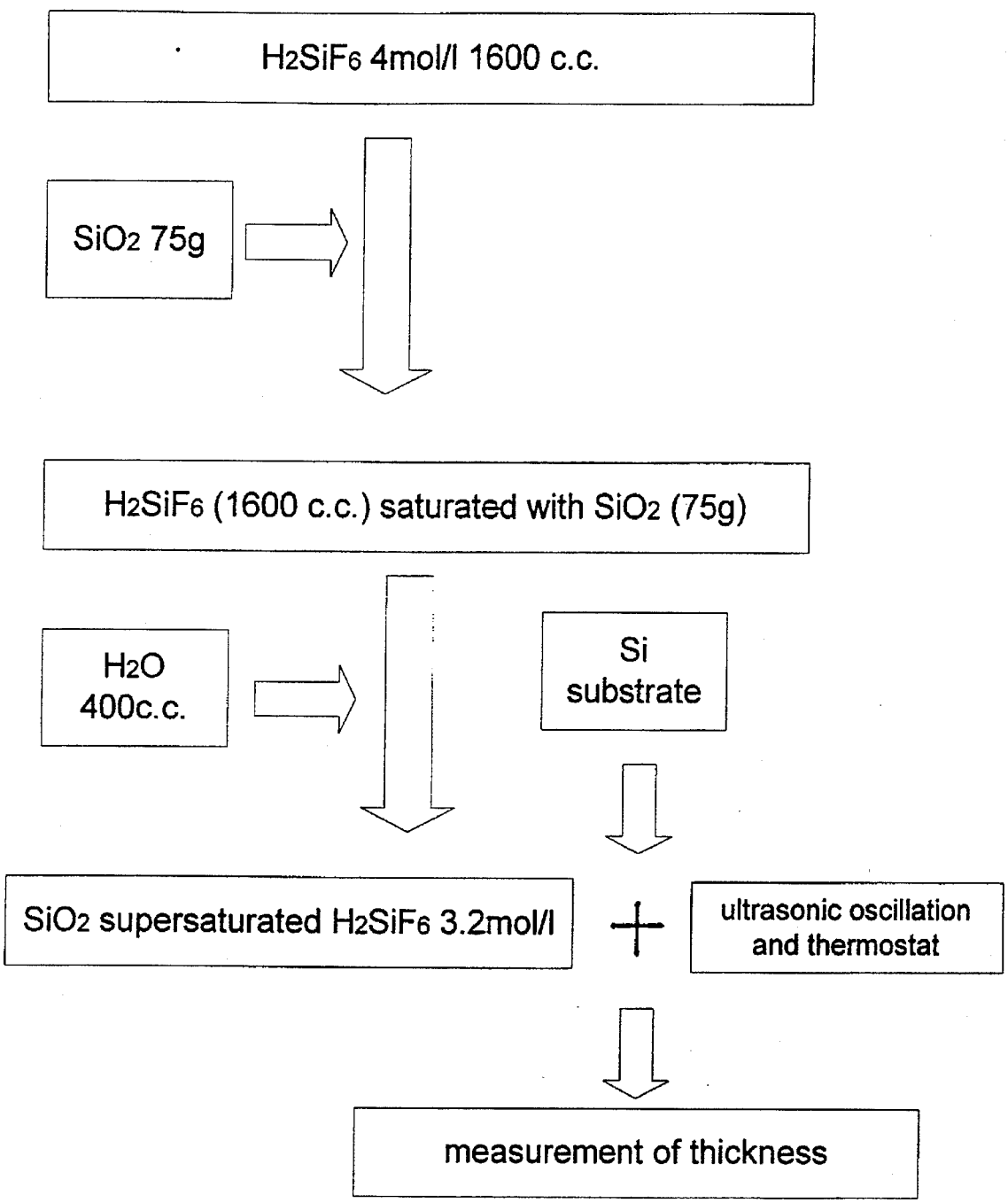
FIG. 2 shows a flow diagram of a preferred embodiment of the present invention.

The liquid phase static deposition method of the present invention makes use of silicon dioxide ($SiO_2$) powder having a purity of 99.99%, and an aqueous solution of hydrosilicofluoric acid ($H_2SiF_6$) having a concentration of 4M. As illustrated in FIG. 2, a $SiO_2$ saturated hydrosilicofluoric acid aqueous solution is prepared by adding 75 grams of the silicon dioxide powder to a vessel containing 1600 c.c. of 4M hydrosilicofluoric acid aqueous solution while stirring at 23° C., and then removing the excess silicon dioxide particles from the resulting mixture by filtration. As a result, a hydrosilicofluoric acid aqueous solution saturated with silicon dioxide is obtained. Finally, 400 c.c. of water is added to the $H_2SiF_6$ aqueous solution saturated with $SiO_2$ to prepare a 3.2M $SiO_2$ supersaturated $H_2SiF_6$ aqueous solution. A 4 inches silicon wafer having P-(100) orientation and 1–5 Ω-cm resistivity is first cleaned in accordance with the RCA standard cleansing procedures before the silicon wafer is disposed in the LPD growth tank 10 containing the 3.2M $SiO_2$ supersaturated $H_2SiF_6$ aqueous solution. An ultrasonic oscillation function of the ultrasonic oscillation water tank 20 is then actuated. The ultrasonic oscillation frequency is adjusted at a fixed value of 20–100 KHz, preferably 30–100

KHz. In the meantime, the thermostat 30 is started to regulate the growth temperature in a range of 10°–50° C., preferably 20°–35° C.

Figure 3:
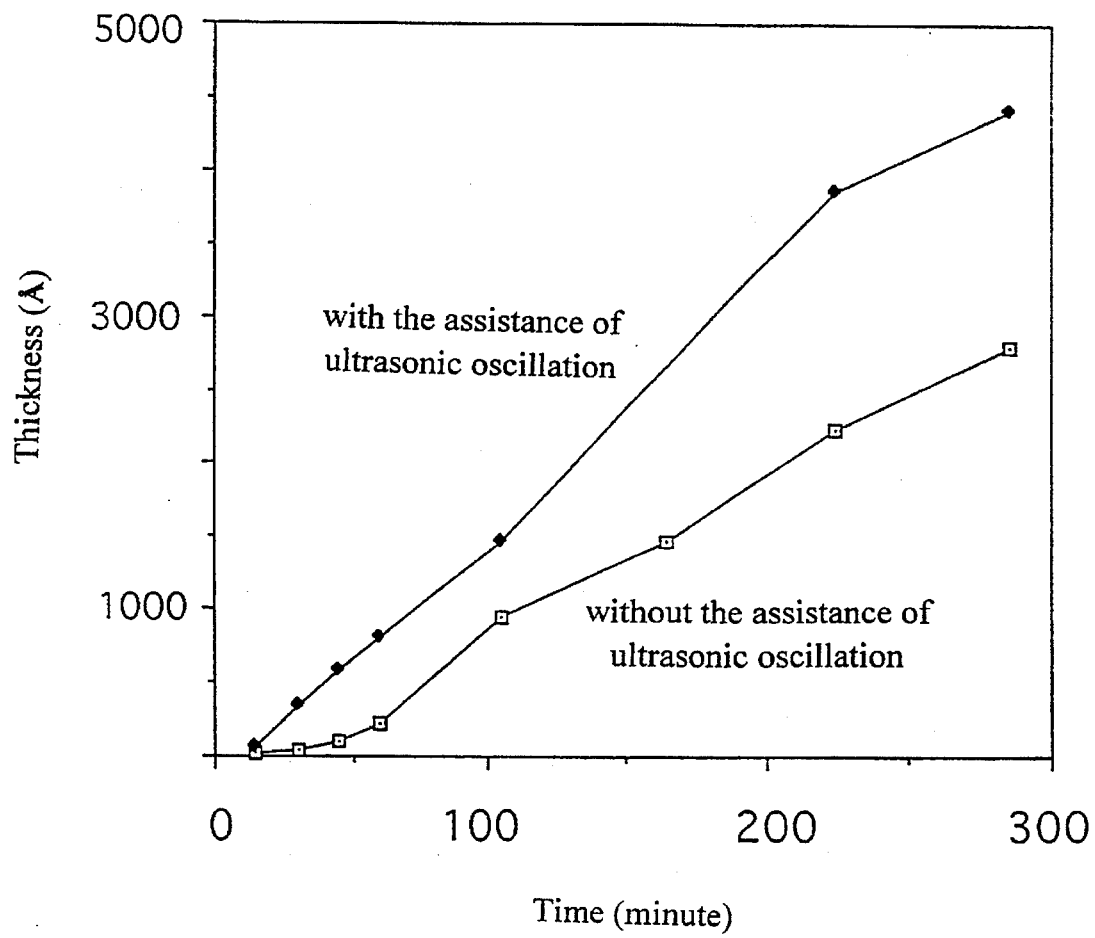
FIG. 3 is a plot illustrating the relationships between the thickness and the growth time of the silicon dioxide grown by the liquid phase static deposition in the presence of the ultrasonic oscillation and in the absence of the ultrasonic oscillation, wherein the curve designated by —♦— is a representation of data obtained by using the ultrasonic oscillation and the curve designated by ☐ is a representation of data obtained without the use of the ultrasonic oscillation.

According to a preferred embodiment of the present invention, the ultrasonic oscillation frequency was kept constantly at 40 KHz while the growth temperature was kept constantly at 33° C. As shown in FIG. 3, the growth rate of the silicon dioxide layer is about 900 Å/hr in the presence of the ultrasonic oscillation. On the other hand, the growth rate of the silicon dioxide layer is about 200 Å/hr in the absence of the ultrasonic oscillation.

It is therefore readily apparent that the method of the present invention is capable of an effective acceleration in the growth rate of silicon dioxide layer, and that the method of the present invention can be applied to speed up the growth rate of an insulation layer of the multilevel interconnection.

The embodiment of the present invention described above is to be regarded in all respects as being merely illustrative and not restrictive. Accordingly, the present invention may be embodied in other specific forms without deviating from the spirit thereof. The present invention is therefore to be limited only by the scopes of the following appended claims.

What is claimed is:

1. A method for enhancing the growth rate of a silicon dioxide layer grown by a liquid phase deposition comprising disposing a semiconductor substrate in a reaction mixture containing a hydrosilicofluoric acid aqueous solution supersaturated with silicon dioxide, and applying an ultrasonic oscillation to said reaction mixture.

2. The method as defined in claim 1, wherein said ultrasonic oscillation has a frequency ranges between 20 and 100 KHz.

3. The method as defined in claim 1, wherein said reaction mixture is kept at a temperature ranging between 10° and 50° C.

4. The method as defined in claim 3, wherein said reaction mixture is kept at a temperature ranging between 20° and 35° C.

* * * * *